US005768152A

United States Patent [19]
Battaline et al.

[11] Patent Number: 5,768,152
[45] Date of Patent: Jun. 16, 1998

[54] PERFORMANCE MONITORING THROUGH JTAG 1149.1 INTERFACE

[75] Inventors: Robert P. Battaline; James R. Robinson, both of Essex Junction, Vt.; Edward H. Welbon, Austin, Tex.; Ralph J. Williams, Essex Junction, Vt.

[73] Assignee: International Business Machines Corp., Armonk, N.Y.

[21] Appl. No.: 705,871

[22] Filed: Aug. 28, 1996

[51] Int. Cl.[6] ................................................. G01B 17/00
[52] U.S. Cl. .................... 364/551.01; 395/183.03
[58] Field of Search ............... 364/551.01; 371/21.1–28; 395/183.01, 183.03, 183.06, 183.13, 183.15, 183.17–183.22

[56] References Cited

U.S. PATENT DOCUMENTS

| 4,947,395 | 8/1990 | Bullinger et al. ............... 371/22.3 |
| 5,231,314 | 7/1993 | Andrews . |
| 5,325,368 | 6/1994 | James et al. . |
| 5,355,369 | 10/1994 | Greenberger et al. . |
| 5,377,198 | 12/1994 | Simpson et al. . |
| 5,381,420 | 1/1995 | Henry ............... 371/22.3 |
| 5,428,624 | 6/1995 | Blair et al. . |
| 5,434,804 | 7/1995 | Bock et al. . |
| 5,459,737 | 10/1995 | Andrews . |
| 5,479,652 | 12/1995 | Dreyer et al. . |
| 5,485,466 | 1/1996 | Lyon et al. ............... 371/22.3 |
| 5,488,688 | 1/1996 | Gonzales et al. . |
| 5,657,253 | 8/1997 | Dreyer et al. ............... 364/551.01 |

*Primary Examiner*—James P. Trammell
*Attorney, Agent, or Firm*—Schmeiser, Olsen & Watts; Eugene I. Shkurko

[57] ABSTRACT

Disclosed is a system and method of providing performance analysis on integrated circuit devices and systems using an IEEE JTAG 1149.1 interface. An integrated circuit device is described that includes an execution control register for receiving a control code from an external device via the JTAG interface, a means for selecting and coupling to one or more specific logic circuits on the device, one or more counters for recording specific events occurring on the logic circuits, and a counter register for managing the counter data and outputting it via the JTAG interface.

19 Claims, 5 Drawing Sheets

PERFORMANCE MONITORING THROUGH JTAG 1149.1 INTERFACE

BACKGROUND OF THE INVENTION

1. Technical Field

The present invention relates to integrated circuit devices and more particularly to a method and system of measuring performance on an integrated circuit device.

2. Related Art

As the demands placed on integrated circuit devices continue to increase, the need to measure the specific performance features of such devices has become particularly important in the design cycle. It is well recognized that the true performance of a system is best measured by monitoring the occurrence of specific internal events. Once it is understood how often such events occur, improved circuit designs can be readily implemented to improve overall chip performance.

Traditional methods of monitoring performance consist of designing into the architecture of the system special performance monitoring registers and counters. These registers and counters are controlled through a combination of external interrupts and software instructions that are executed on the system or microprocessor while the performance is being measured. Unfortunately, the act itself of monitoring performance of a system using these traditional methods contaminates the performance data measured. One reason for this is that performance monitoring is not real-time because the software being run must be interrupted. Thus, the flow of the code going through the processor, whose performance is being monitored, has to be altered. This creates a severe limitation for many processors, especially those that include advanced operations such as "out-of-order" executions and the like. Moreover, the addition of special software to control performance monitoring will have an effect on the overall performance of the device being monitored.

Another limitation of the traditional method is that the events which often need to be monitored may not be accessible by the microprocessor. Furthermore, components in the system may have useful event information, but no method exists for retrieving the data.

Thus, a needs exists to provide a system and method of monitoring performance on integrated circuit devices and systems without compromising system performance.

SUMMARY OF THE INVENTION

The present invention provides a system and method for monitoring performance of integrated circuit devices on a computer system. The method and system described herein utilizes the industry standard JTAG (Joint Test Action Group) IEEE 1149.1 Test Access Port designed into most present day microprocessors, microcontrollers and other system components. For example, all IBM Power PC microprocessors and microcontrollers, Intel Pentium and Pentium Pro microprocessors, as well as other system chip sets all utilize JTAG access ports. In addition, many system boards designed today include JTAG support to access the components that contain JTAG logic.

The system includes at least one integrated circuit device comprising a JTAG 1149.1 compliant interface, an event monitor control register coupled to the interface for storing a control code downloaded via the interface, a control system for reading the control code and selecting and coupling to one of many possible circuits on the integrated circuit device, a counter for counting events occurring on the selected circuit, and an event count register coupled to the JTAG 1149.1 compliant interface for holding a count total from the counter and outputting it via the JTAG 1149.1 interface. The system may include a plurality of integrated circuit devices serially connected to a JTAG 1149.1 compliant port wherein each device includes all of the features mentioned above. Each device may include more than one counter for monitoring more than one event at a time. The event monitor control register, event count register, and counters may be comprised of existing JTAG 1149.1 registers and counters already on the device, or they may be comprised of new registers and counters designed into the chip.

The method for monitoring performance includes the steps of selecting an event to monitor with some external device such as a computer having debugging software or an in-circuit-emulator (ICE), downloading a control code from the external device to an integrated circuit device via the JTAG 1149.1 compliant interface, loading the control code to an event monitor control register located in the device, selecting and electrically coupling to at least one of a plurality of circuits, accumulating in at least one counter occurrences of events occurring at the selected circuit(s), loading at least one total count in an event count register, and outputting the total count(s) to an external device via the JTAG 1149.1 compliant interface.

It is therefore an advantage of the present invention to provide a method of measuring the internal performance of a system without having to run any special code therein.

It is therefore a further advantage of the present invention to take advantage of existing JTAG 1149.1 interface systems on existing boards and components.

It is therefore a further advantage of the present invention to provide a system and method of performance monitoring without the use of external interrupts.

It is therefore a further advantage of the present invention to provide a means for choosing specific events to monitor.

It is therefore a further advantage of the present invention to provide event information for any desired circuit within an integrated circuit device.

The foregoing and other objects, features and advantages of the invention will be more apparent from the following more particular description of the preferred embodiments of the invention as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT INVENTION

JTAG 1149.1 Background

IEEE standard 1149.1 was developed by a Joint Test Action Group (JTAG) and is referred to herein as simply 1149.1 or JTAG. JTAG was developed as a standardized serial test bus for testing integrated circuit components, their interconnections on a printed circuit board, and for observing or modifying circuit activity during normal operation of the components. The JTAG test access port logic is an entity which is entirety separate from the core component operation on an integrated circuit device, and is accessed by five unique and dedicated component pins. The 1149.1 standard defines how the logic must function to be standard compliant. It also states that the logic, in addition to performing the JTAG standard public functions, can also perform private functions which are unique to the components operation.

As noted above, JTAG was primarily developed for testing the interconnections between components in a computer system. This invention utilizes the private function capabilities of the JTAG standard to monitor, rather than test, the internal performance of a microprocessor or any other system component. By using the existing "testing" protocol and componentry, this invention provides a system and method of improved performance monitoring with a few minor on-chip modifications. It is presumed that the reader is familiar with the JTAG 1149.1 protocol which is hereby incorporated by reference.

Preferred Embodiment

Figure 1:
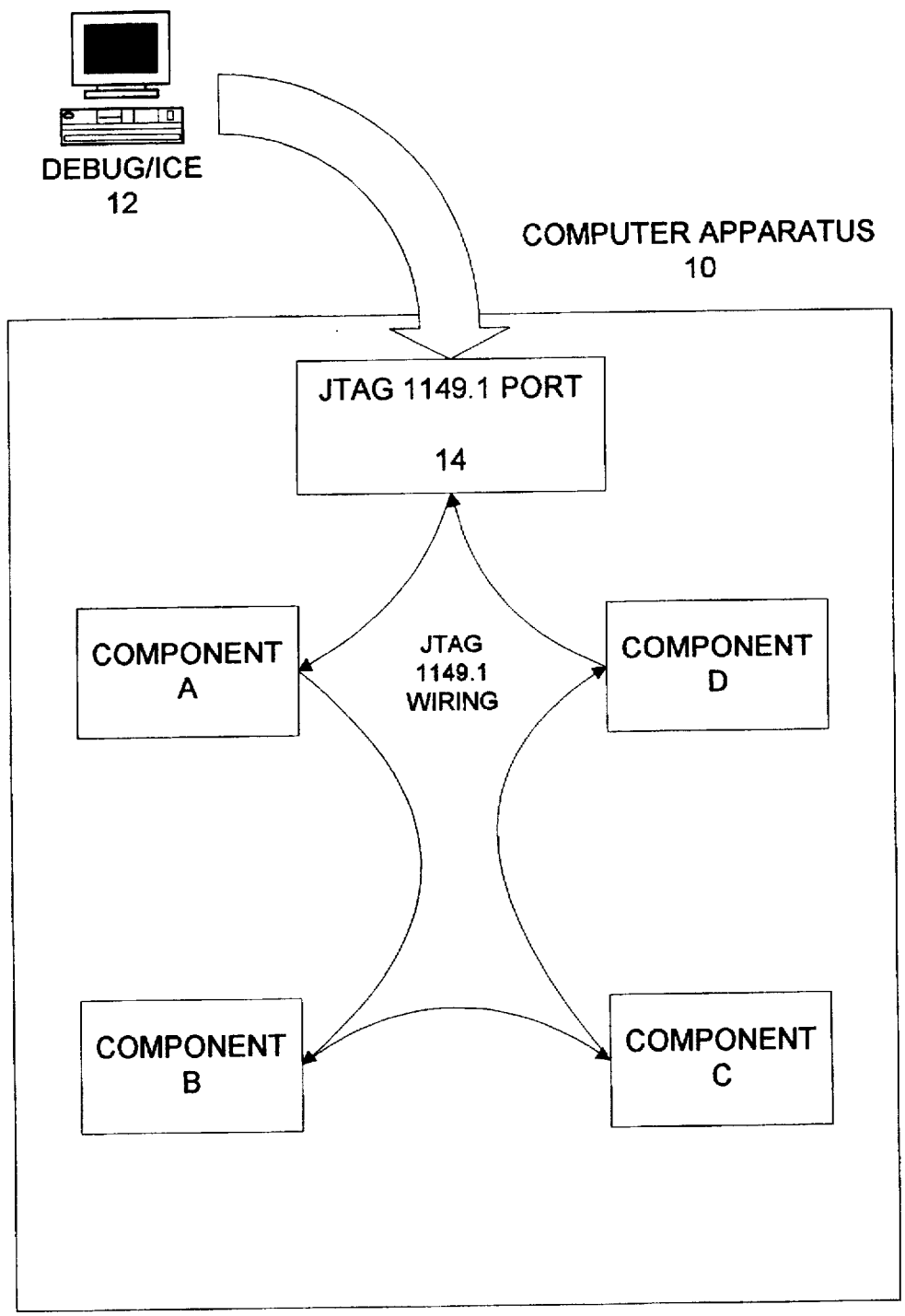
FIG. 1 depicts a high level representation of a JTAG performance monitoring system in accordance with a preferred embodiment of this invention.

Referring now to the drawings, FIG. 1 depicts a system in which a JTAG performance monitor could be used. The computer apparatus or system 10 whose performance is being monitored may have several JTAG compliant components each of which includes its own built-in JTAG performance monitoring support. In this case, all of the components A, B, C, D are capable of communicating through a common JTAG 1149.1 port 14 to an external device 12. External device 12 may include any type of apparatus that includes communication software, debugging or in circuit emulation. It should be recognized that this is but one example of many possible component configurations for which this invention could work.

Figure 2:
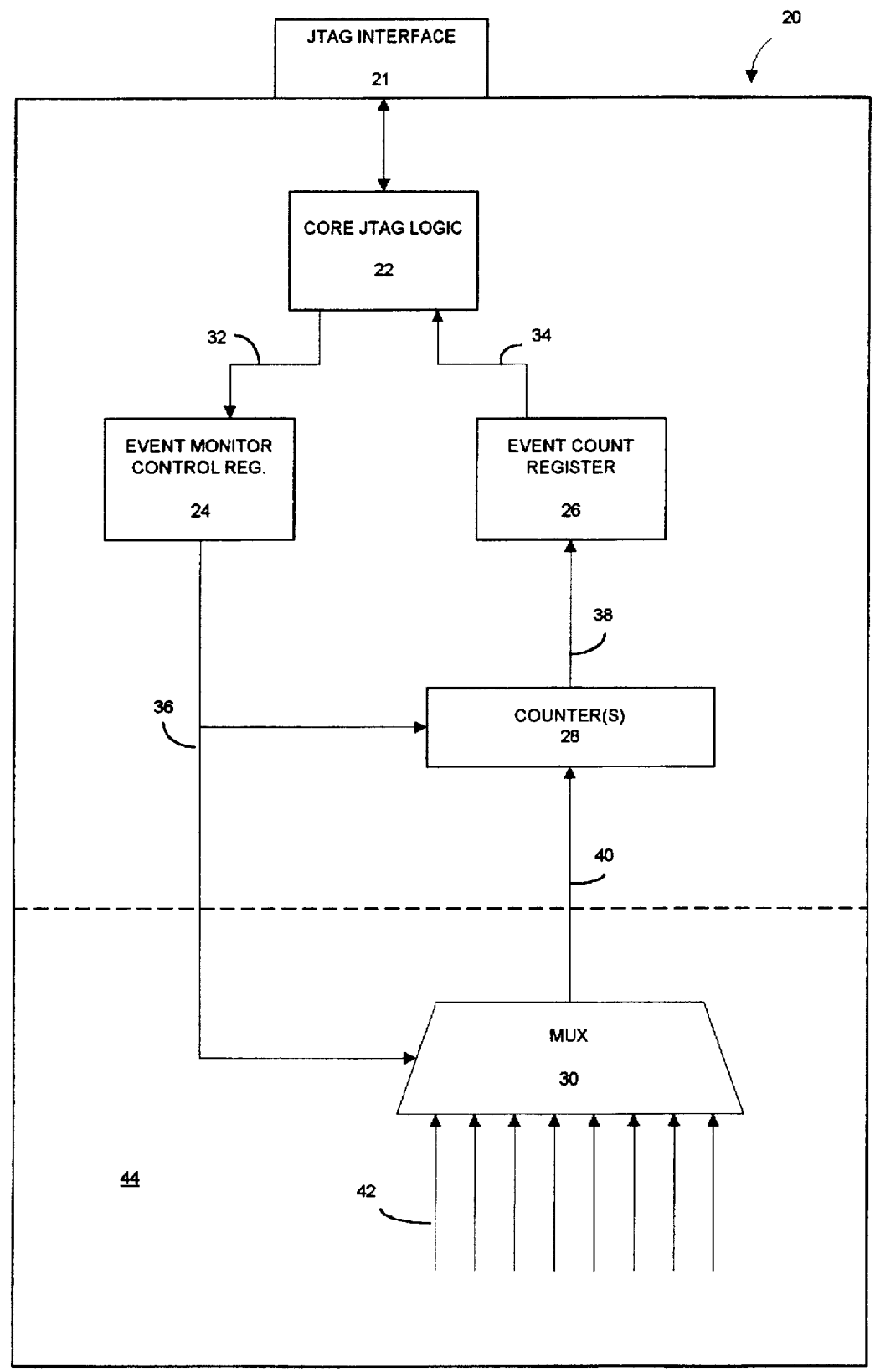
FIG. 2 depicts a block diagram of an integrated circuit device in accordance with a preferred embodiment of this invention.

Referring now to FIG. 2, a single integrated circuit device or component 20 is shown. Block 22 represents the core logic/circuits necessary to implement the JTAG 1149.1 standard. This includes an ability to communicate externally through JTAG interface 21. JTAG interface 21 typically comprises five pins on the exterior of an integrated circuit device. Component core logic 44 represents the remaining logic on the integrated circuit device. Event monitor control register 24, event count register 26, and counter(s) 28 represent additional JTAG components required for this implementation. Both registers 24 and 26 conform to the JTAG 1149.1 protocol. It should be recognized that both registers 24 and 26 may use existing JTAG 1149.1 registers (such as boundary scan registers) already implemented in a standard JTAG configuration. Because testing and performance monitoring are not typically done at the same time, certain registers could be shared amongst the two tasks.

The event monitor control register 24 is used to define which event(s) to monitor and when to monitor them. If more than one counter is implemented, this register would be used to define which counter will count which event. This register can also select how the counters should be enabled; either purely through JTAG, or when a core logic event occurs such as when a register is written through software (traditional method). During operation, the event monitor control register 24 will receive a control code (or "event select data" 32) from the JTAG logic 22 that was downloaded via JTAG interface 21.

When the event monitor control register 24 receives a control code, it causes control data to be dispatched along lines 36 which enables counter(s) 28 and causes multiplexor 30 to select a particular circuit for monitoring. Multiplexor (MUX) 30 provides a means of selecting an event at a point of origin in the logic circuitry and thereby minimize global wiring. Thus, the event monitor control register 24 and multiplexor 30 provide a control means for selecting and coupling to a predetermined circuit on the integrated circuit device. Lines 42 coming in to multiplexor 30 represent signals coming from various logic circuits that may be of interest to monitor. Thus, it may be required to provide signal lines in the component core logic that are specifically used for monitoring purposes.

Counter(s) 28 provides the means for collecting event information delivered over signal line 40. Counter(s) 28 are typically basic adders with a register, and are typically wide counters (32–64 bytes) running synchronous to the component core logic and are capable of counting from zero to multiple events per cycle. An implementation with more than one counter allows the comparison of two or more events over a period of time or the capability to measure the number occurrences of an event over a number of clock cycles measured.

Based on the enabling and disabling codes generated by the event monitor control register 24, counter(s) 28 will pass the count data to the event count register 26 over signal line 38 where it can stored and forwarded out through the JTAG interface via line 34. Typically the count data coming from the counter to the event count register 26 will be in parallel while the count data leaving the event count register 26 and being outputted through the JTAG interface 21 will be serial.

Figure 3:
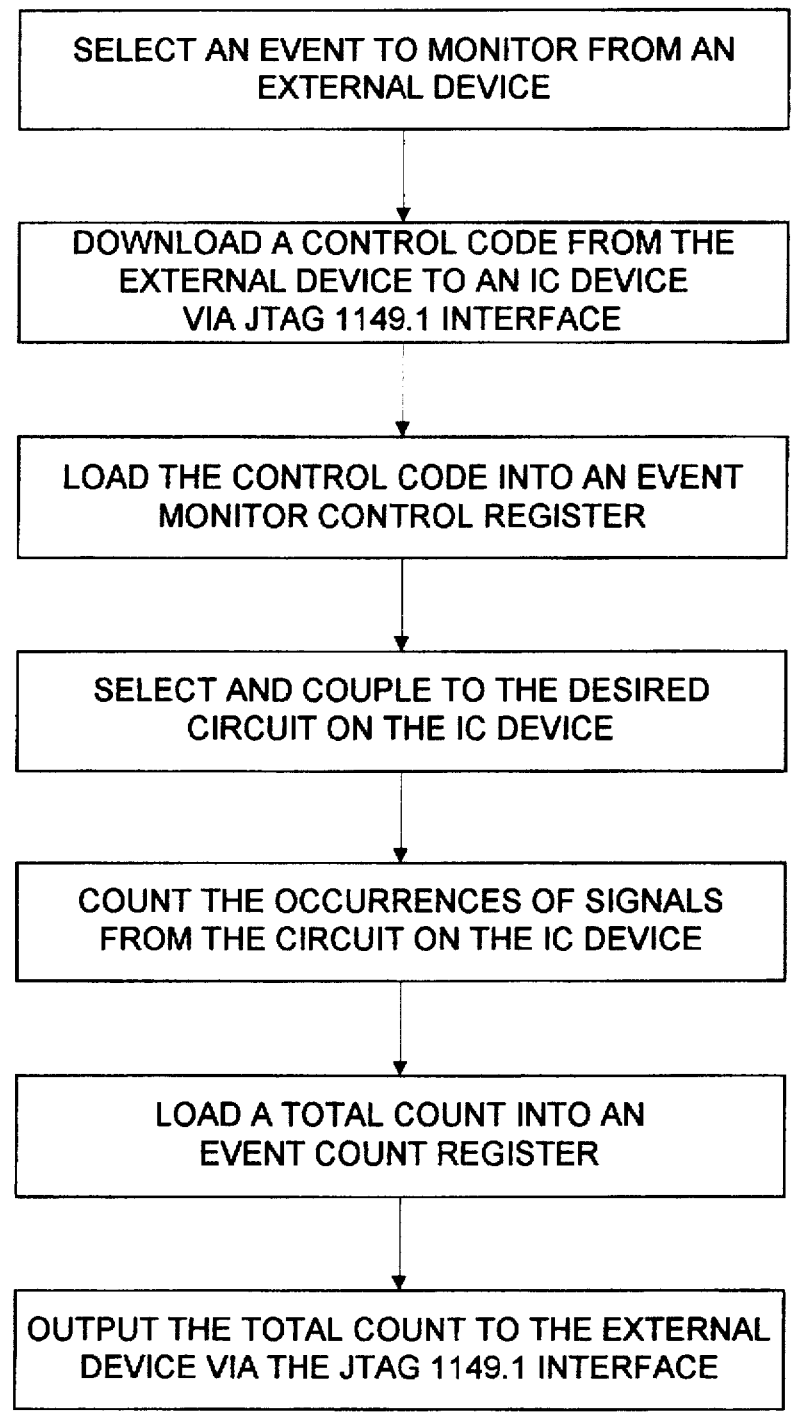
FIG. 3 depicts a flow diagram of a method of performance monitoring in accordance with a preferred embodiment of this invention.

Referring now to FIG. 3, a flow chart is shown which describes the preferred method of operation. First, one or more events are selected for monitoring from an external device. Next, the external device downloads a control code to an integrated circuit device via the JTAG 1149.1 interface on the integrated circuit device. Subsequently, the control code is loaded into an event monitor control register. The desired circuit is then selected and coupled to on the integrated circuit device. Occurrences of signals or events are then counted as they occur on the selected circuit on the integrated circuit device. A total count is then loaded into an event count register. Finally, a total count is then output back to the external device via the JTAG 1149.1.

Figure 4:
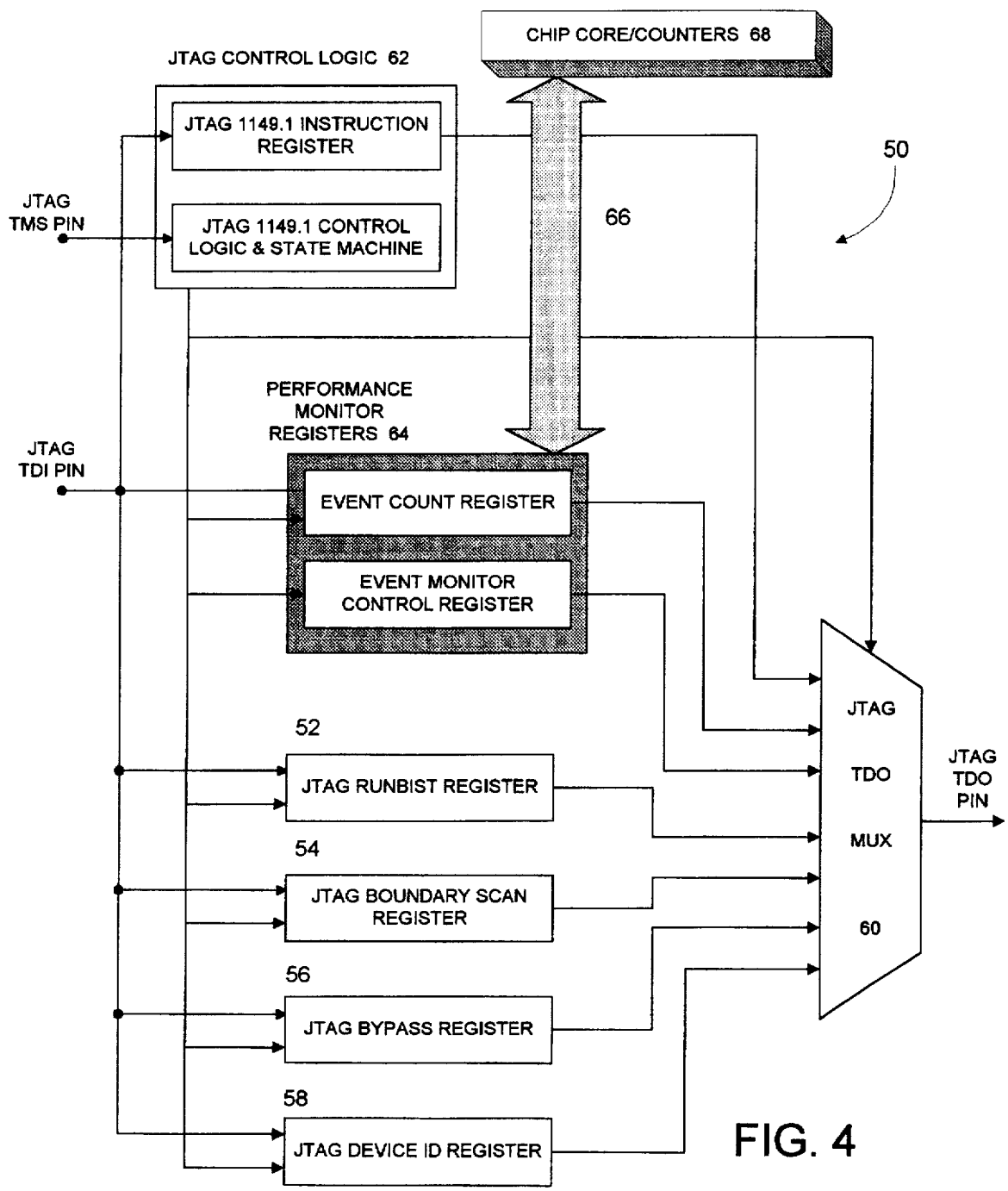
FIG. 4 depicts a JTAG system having additional performance monitor registers in accordance with a preferred embodiment of this invention.

FIG. 4 depicts a standard JTAG system 50 with the inclusion of two new registers 64 for performance monitoring. Registers 52, 54, 56 and 58 are standard registers defined by JTAG. JTAG TDO MUX 60 is a multiplexor that determines which register will drive the TDO pin based upon JTAG control logic 62. Interface arrow 66 shows the interface to the counters and the events occurring in the chip core 68, that can be monitored.

Figure 5:
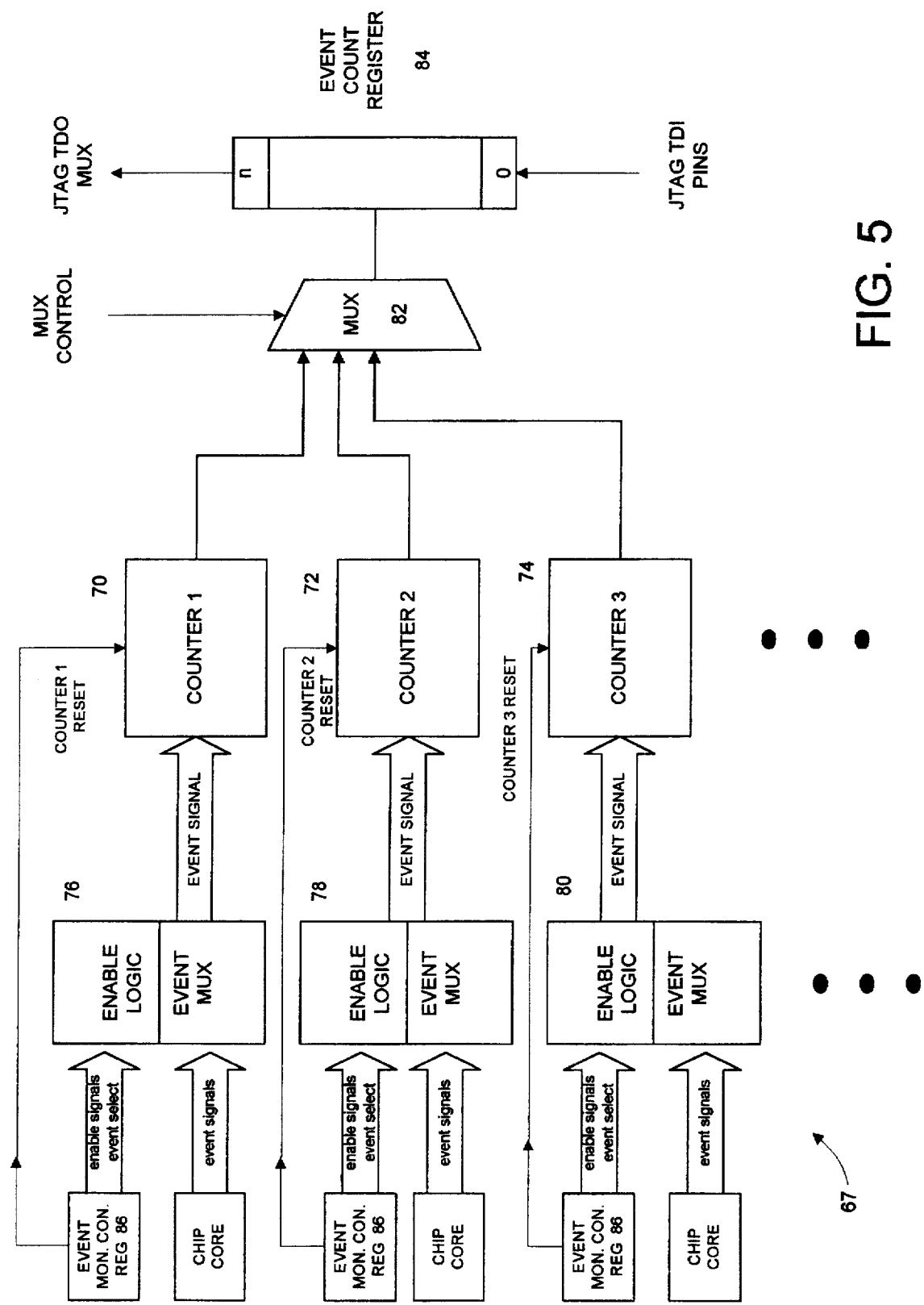
FIG. 5 depicts a high level overview of the control means for driving the JTAG performance monitoring system.

FIG. 5 depicts a high level block diagram of the control means 67 that interfaces between performance monitor registers and the chip core. In particular, this figure shows a system utilizing a plurality of counters 70, 72 and 74. It can be seen that each counter has an associated event multiplexor and enable logic 76, 78 and 80 and an associated counter reset. The event multiplexors, which are controlled by event select signals in the event monitor control register 86, read event signals from the chip core. Enable signals, which emanate from the event monitor control register 86, may provide a system enable, a means of enabling through JTAG or software, and a means for determining when it is safe to start counting (to avoid metastability problems caused by two systems running on two asynchronous clocks). The event monitor control register 86 also provides counter resets for resetting the counters as needed.

The event monitor control register may be a two stage register (shift and update) that includes bits for resetting each counter, bits for enabling from core (i.e., via software), bits for enabling each counter, and bits for selecting events.

In addition, the system may require additional event monitor control register valid logic for preventing metastability problems caused by the fact that the JTAG clock is asynchronous to the system clock.

The enable logic may include any logic devices to create the proper functionality for moving the selected event signal into the associated counter. In the preferred embodiment, each clock signal causes one event signal (either a 1 or a 0) to be forwared to each counter. If a 1 is present, the counter will increment. If a 0 is present the counter will remain unchanged for the cycle. It should also be noted that events can be combined to cause the counter to increment by more than one for each clock cycle.

Data is then retrieved from the counters through system mulitplexor 82, which controls the flow of count information to the event count register 84. System MUX 82 is controlled by a JTAG instruction.

It should be recognized that the logic circuits necessary to implement this system may include any combination suitable for performing the necessary functions. In addition the foregoing description of the preferred embodiments of the invention have been presented for purposes of illustration description. It is not intended to be exhaustive or to limit the invention to the precise form disclosed, and obviously many modifications and variations are possible in light of the above teaching. Such modifications and variations that may be apparent to a person skilled in the art are intended to be included within the scope of this invention as defined by the accompanying claims.

We claim:

1. A computer apparatus having a system for monitoring performance, said apparatus having a plurality of integrated circuit devices serially connected to a JTAG 1149.1 compliance port, each said integrated circuit device comprising:

a JTAG 1149.1 compliant interface;

an event monitor control register coupled to said JTAG 1149.1 compliant interface, said event monitor control register for storing a control code downloaded via said JTAG 1149.1 compliant interface;

a control system, said control system including logic to read said control code and select and couple to one of a plurality of circuits on said first integrated circuit device;

a counter, said counter for reading and accumulating signals occurring on said one of said plurality of circuits on said first integrated circuit device; and an event count register coupled to said JTAG 1149.1 compliant interface, said event count register for reading a total count from said counter and outputting it via said JTAG 1149.1 compliant interface.

2. The computer apparatus of claim 1 wherein said event monitor control register is an existing JTAG 1149.1 register.

3. The computer apparatus of claim 1 wherein said event count register is an existing JTAG 1149.1 register.

4. The computer apparatus of claim 1 wherein said first integrated circuit device includes a plurality of counters.

5. The computer apparatus of claim 1 wherein said counter runs synchronous to a system clock on said first integrated circuit device.

6. The computer apparatus of claim 1 wherein said event monitor control register includes means for defining which of said plurality of circuits to monitor.

7. The computer apparatus of claim 4 wherein said event monitor control register includes means for defining an event for each of said plurality of counters.

8. The computer apparatus of claim 1 wherein said event monitor control register includes means for enabling said counter.

9. An integrated circuit device having performance monitoring capabilities, comprising:

a JTAG 1149.1 compliant interface;

an external device, said external device for downloading a control code via said JTAG 1149.1 compliant interface:

means for storing said control code inputted via said JTAG 1149.1 compliant interface;

control means for selecting and coupling to at least one of a plurality of circuits on said integrated circuit device based upon said control code;

counting means coupled to said control means, said counting means for monitoring signals on said at least one of said plurality of circuits and accumulating a total count for each of said at least one of said plurality of circuits and accumulating a total count for each of said at least one of said plurality of circuits; and means for outputting said total count via said JTAG 1149.1 compliant interface.

10. The integrated circuit device of claim 9 wherein said means for storing a control code includes an event monitor control register.

11. The integrated circuit device of claim 9 wherein said control means includes a multiplexor.

12. The integrated circuit device of claim 9 wherein said counting means includes at least one counter be driven by a clock operating synchronously with a system clock.

13. The integrated circuit device of claim 9 wherein said means for outputting said total count includes an event count register.

14. A method for monitoring events on an integrated circuit device wherein said integrated circuit device includes a JTAG 1149.1 compliant interface and a control system for monitoring a plurality of circuits, said method comprising the steps of:

using an external device to select a first event to monitor;

downloading a control code from said external device to said integrated circuit device via said JTAG 1149.1 compliant interface;

writing said control code to an event monitor control register located in said integrated circuit device;

selecting and electrically coupling to one of said plurality of circuits;

accumulating in a counter occurrences of electrical signals at one of said plurality of circuits;

loading a total count in an event count register; and outputting said total count to said external device via said JTAG 1149.1 compliant interface.

15. The method of claim 14 wherein said external device includes an in-circuit emulator.

16. The method of claim 14 wherein the step of writing said control code to an event monitor control register is done serially.

17. The method of claim 14 wherein said control code defines which of said plurality of circuits to select and couple to.

18. The method of claim 14 further comprising the step of enabling the counter.

19. The method of claim 14 further comprising the step of selecting and electrically coupling to more than one of said plurality of circuits.

* * * * *